United States Patent
Lee et al.

(10) Patent No.: US 7,410,913 B2
(45) Date of Patent: Aug. 12, 2008

(54) METHOD OF MANUFACTURING SILICON RICH OXIDE (SRO) AND SEMICONDUCTOR DEVICE EMPLOYING SRO

(75) Inventors: Jung-Hyun Lee, Yongin-si (KR); Sang-Bong Bang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 117 days.

(21) Appl. No.: 11/519,083

(22) Filed: Sep. 12, 2006

(65) Prior Publication Data

US 2007/0072424 A1    Mar. 29, 2007

(51) Int. Cl.
*H01L 21/31* (2006.01)
(52) U.S. Cl. .................. 438/778; 438/780; 438/783; 438/787; 438/788; 438/789; 438/790; 257/E21.09; 257/E21.704
(58) Field of Classification Search .................. 438/778, 438/780, 783, 787, 788, 789, 790
See application file for complete search history.

(56) References Cited

U.S. PATENT DOCUMENTS 4,656,729 A * 4/1987 Kroll et al. .................. 438/261
2005/0151259 A1* 7/2005 Hosoda et al. .............. 257/758

* cited by examiner

*Primary Examiner*—Thanh V Pham
(74) *Attorney, Agent, or Firm*—Harness, Dickey & Pierce, P.L.C.

(57) ABSTRACT

Provided are methods for manufacturing silicon rich oxide (SRO) layers useful in the fabrication of semiconductor devices, for example, non-volatile memory devices, and methods for fabricating semiconductor devices incorporating such SRO layers. The methods include absorbing a first silicon source gas onto the substrate, oxidizing the first absorbed layer to form a silicon oxide layer, absorbing a second silicon source gas onto the substrate and reducing the second absorbed layer to form a silicon layer. The combination of the silicon oxide layer(s) and the silicon layer(s) comprise, in turn, a composite SRO layer. These manufacturing methods facilitate control of the oxygen concentration in the SRO, the relative thicknesses of the silicon oxide and silicon layers, and provides improved step coverage, thus allowing the manufacturing of high quality semiconductor devices.

31 Claims, 12 Drawing Sheets

Si : SiO2 = 1:6, 10# cycles

FIG. 5B

Si : SiO = 2:12, 5# cycles

FIG. 5C

Si : SiO2 = 4:24, 3# cycles

— SOI Substrate —

FIG. 7B

— 1st PR Mask for pad formation —

FIG. 7C

– Pattern & Strip –

FIG. 7D

– 2nd PR Mask for pin formation –

FIG. 7E

– Pattern & Strip –

FIG. 7F

– Gate insulator formation –

FIG. 7G

– P-Si deposition –

FIG. 7H

– 3rd PR Mask formation –

FIG. 7I

– Pattern and strip –

FIG. 7J

– Implantation –

METHOD OF MANUFACTURING SILICON RICH OXIDE (SRO) AND SEMICONDUCTOR DEVICE EMPLOYING SRO

PRIORITY STATEMENT

This application claims priority under 35 U.S.C. § 119 from Korean Patent Application No. 10-2005-0088713, filed on Sep. 23, 2005, in the Korean Intellectual Property Office, the disclosure of which is incorporated herein in its entirety by reference.

BACKGROUND OF THE INVENTION

1. Field of the Invention

The invention relates to methods for manufacturing silicon rich oxide (SRO), and more particularly, to methods for manufacturing semiconductor devices incorporating one or more regions of SRO.

2. Description of the Related Art

Charge storage devices incorporating SRO have been receiving increasing attention as a result of various advantages provided by the SRO when utilized as a charge trapping layer. Controlling the ratio of Si and $SiO_2$ in the SRO material incorporated in dynamic random access memory (DRAM) devices can provide improved electrical characteristics relative to conventional DRAM devices. In particular, annealing a SRO having an appropriate atomic ratio of silicon and oxygen atoms (Si:O ratio) at a sufficiently high temperature will tend to cause segregation of Si and $SiO_2$ within the SRO layer. Accordingly, annealing such SRO materials in this manner can form Si dots that are distinct from the $SiO_2$. A memory device incorporating Si nanocrystals generated using such a Si dot formation technique is discussed in, for example, U.S. Pat. No. 6,690,059, the contents of which are incorporated herein, in its entirety and to the extent consistent with the present disclosure, by reference.

In general, SRO materials can be formed by chemical vapor deposition (CVD) or atomic layer deposition (ALD) processes. CVD processes, however, while generally providing better control over the Si:O ratio than ALD processes, tend to exhibit poor step coverage due to plasma shielding effect. Conversely, ALD processes, while generally providing better step coverage than CVD processes, tend to exhibit poor control over the Si:O ratio within the SRO layer due to the nature of the exchange reaction between a precursor, for example, tetraethoxysilane (TEOS, $Si(OC_2H_5)_4$, also referred to in the alternative as tetraethosiloxane or tetraethylorthosilicate), and an oxidation agent, for example, $H_2O$.

SUMMARY OF THE INVENTION

Example embodiments of the invention include methods of manufacturing silicon rich oxide (SRO) layers that provide both improved step coverage and improved control over the silicon:oxygen ratio within the resulting SRO materials. Other example embodiments of the invention include methods of manufacturing semiconductor devices that incorporate such improved SRO materials.

A method of manufacturing SRO having $SiO_2$ and extra Si on a substrate according to an example embodiment of the invention includes the steps of: absorbing a first silicon source gas onto the substrate, the first silicon source gas being substantially free of oxygen, forming a $SiO_2$ layer by reacting the absorbed first silicon source gas with a first reaction gas that contains oxygen; and forming a Si layer by reducing a second silicon source gas, the second silicon source gas being substantially free of oxygen, using a second reaction gas.

A method of manufacturing a semiconductor device including a silicon active layer having a source and a drain on both sides thereof, a gate insulating layer with SRO covering the active layer, and a gate overlying the gate insulating layer and creating an electric field on the active layer according to another example embodiment of the invention includes the steps of absorbing a first silicon source gas onto the substrate, the first silicon source gas being substantially free of oxygen, forming a silicon oxide layer as the result of an oxidation reaction between a first reaction gas containing oxygen and the first silicon source gas; and forming a silicon layer as a result of reduction reaction between a second silicon source gas, the second silicon source gas being substantially free of oxygen, and a second reaction gas. As will be appreciated, the inert gas purge, for example, argon (Ar), can be combined with increased evacuation of the reaction chamber using vacuum pumps to remove the unabsorbed silicon source gas(es) more quickly. As used herein, the term "substantially free of oxygen" describes those gases indicates that the primary molecules comprising the silicon source gas include no atomic oxygen and the source gas itself includes no more than the trace quantities of oxygen that are conventionally present in semiconductor grade gases.

The steps for forming the silicon oxide layer by an oxidation reaction and the steps for forming the silicon layer by a reduction reaction are alternately repeated to form a multi-layer stack structure including alternating layers of silicon oxide and silicon layers. Each silicon oxide layer and each silicon layer may independently comprise one or more atomic layers to form single and multilayer structures respectively. An oxygen-containing plasma is utilized in forming the silicon oxide layer(s) and a hydrogen-rich plasma is utilized in forming the silicon layer(s). The first and second silicon source gases may be the same precursor compound, for example, a SiCl-based precursor such as hexachlorodisilane (HCDS). $H_2O$ may be utilized as the first reaction gas for reacting with the first silicon source and $H_2$ may be utilized as the second reaction gas for reacting with the second silicon source.

Methods of forming a silicon rich oxide (SRO) layer on a substrate according to an example embodiment of the invention will generally include introducing the substrate into a reaction chamber; introducing a first silicon source gas into the reaction chamber under conditions whereby a portion of the first silicon source gas is absorbed on a first substrate surface to form a first silicon source layer, the first silicon source gas being substantially free of oxygen; introducing a first reaction gas into the reaction chamber under conditions sufficient to form an oxidizing plasma; reacting the first silicon source layer and the oxidizing plasma to form a silicon oxide layer on the first substrate surface; introducing a second silicon source gas into the reaction chamber under conditions whereby a portion of the second silicon source gas is absorbed on a surface of the silicon oxide layer to form a second silicon source layer, the second silicon source gas being substantially free of oxygen; introducing a second reaction gas into the reaction chamber under conditions sufficient to form a reducing plasma; and reacting the second silicon source layer and the reducing plasma to form a silicon layer, wherein the combination of the silicon oxide layer and the silicon layer comprise the SRO layer.

Methods according to the invention may also include repeated formation of the silicon oxide and/or silicon layers to form a plurality of silicon oxide layers separated by a corresponding plurality of silicon layers. The individual silicon and silicon oxide layers may also comprise a plurality of atomic layers and the silicon and silicon oxide layers may include different numbers of atomic layers to produce layers having different thicknesses and thereby control the Si:O ratio within the resulting composite SRO layer. The reaction gas used for forming the oxidizing plasma may be selected from a group consisting of $H_2O$, $H_2O_2$, $O_2$, $O_3$ and mixtures thereof and the reaction gas used for forming the reducing plasma may be selected from a group consisting of $H_2$, $NH_3$, HCl and mixtures thereof. The first silicon source gas and the second silicon sources may be independently selected from a group consisting of $SiX_aH_b$, $Si_2X_cH_d$ and mixtures thereof, wherein X represents a halogen selected from a group consisting of Cl, F, Br and mixtures thereof, and further wherein a, b, c and d are integers satisfying the expressions a+b=4 and c+d=6. The first silicon source gas and second silicon source gas may be identical, for example, hexachlorodisilane (HCDS), or may be different. In one example embodiment of the invention, $H_2O$ may be utilized as the first reaction gas while $H_2$ is utilized as the second reaction gas for respectively oxidizing and reducing an absorbed layer of HCDS.

Methods of manufacturing a semiconductor device according to an example embodiment of the invention will generally include forming an active region on a semiconductor substrate; forming a gate insulating layer on the active region; forming a gate electrode on the gate insulating layer for controlling an electrical field within the portion of the active layer underlying the gate electrode, wherein forming the gate insulating layer further comprises fabricating a silicon rich oxide (SRO) layer by absorbing a first silicon source gas onto a substrate surface to form a first silicon source layer, the first silicon source gas being substantially free of oxygen; oxidizing the silicon source layer to form a silicon oxide layer; absorbing a second silicon source gas onto a substrate surface to form a second silicon source layer, the second silicon source gas being substantially free of oxygen; and reducing the second silicon source layer to form a silicon layer; wherein the silicon oxide layer and the silicon layer comprise the SRO layer.

Additional example embodiments of methods for fabricating semiconductor devices in accord with the invention may include repeating the formation steps to produce a multilayer SRO layer having alternating silicon oxide layers and silicon layers. Similarly, the formation steps may be repeated to form a multilayer silicon oxide layers before forming a next silicon layer and/or to form a multilayer silicon layer before forming a next silicon oxide layer. The number of times the formation steps are repeated for the silicon oxide and silicon layers respectively may be the same or different and may be expressed as a ratio of, for example, 4:1 to 7:1. As noted above, the first silicon source gas and the second silicon sources may be independently are selected from a group consisting of $SiX_aH_b$, $Si_2X_cH_d$ and mixtures thereof, wherein X represents a halogen selected from a group consisting of Cl, F, Br and mixtures and combinations thereof, and further wherein a, b, c and d are integers satisfying the expressions a+b=4 and c+d=6. In other example embodiments, the first silicon source gas and the second silicon sources may be independently selected from a group consisting of $SiCl_aH_b$, $Si_2Cl_cH_d$ and mixtures thereof, and further wherein a, b, c and d are again integers satisfying the expressions a+b=4 and c+d=6. Both the first silicon source gas and second silicon source gas may, for example, be hexachlorodisilane (HCDS). The first reaction gas, for example, $H_2O$, will be selected to produce an oxidizing species when converted to a plasma and the second reaction gas, for example, $H_2$, will be selected to produce a reducing species when converted to a plasma.

BRIEF DESCRIPTION OF THE DRAWINGS

Example embodiments of the methods that may be utilized in practicing the invention and example embodiments of the semiconductor devices incorporating such structures are addressed more fully below with reference to the attached drawings in which.

It should be noted that these Figures are intended to illustrate the general characteristics of methods and materials of certain example embodiments of the invention to supplement the written description provided below. These drawings are not, however, to scale and may not precisely reflect the characteristics of any given embodiment, and should not be interpreted as defining or limiting the range of values or properties of embodiments within the scope of this invention. In particular, the relative thicknesses and positioning of layers or regions may be reduced or exaggerated for clarity. The use of similar or identical reference numbers in the various drawings is intended to indicate the presence of a similar or identical element or feature.

DETAILED DESCRIPTION OF THE INVENTION

Figure 1A:
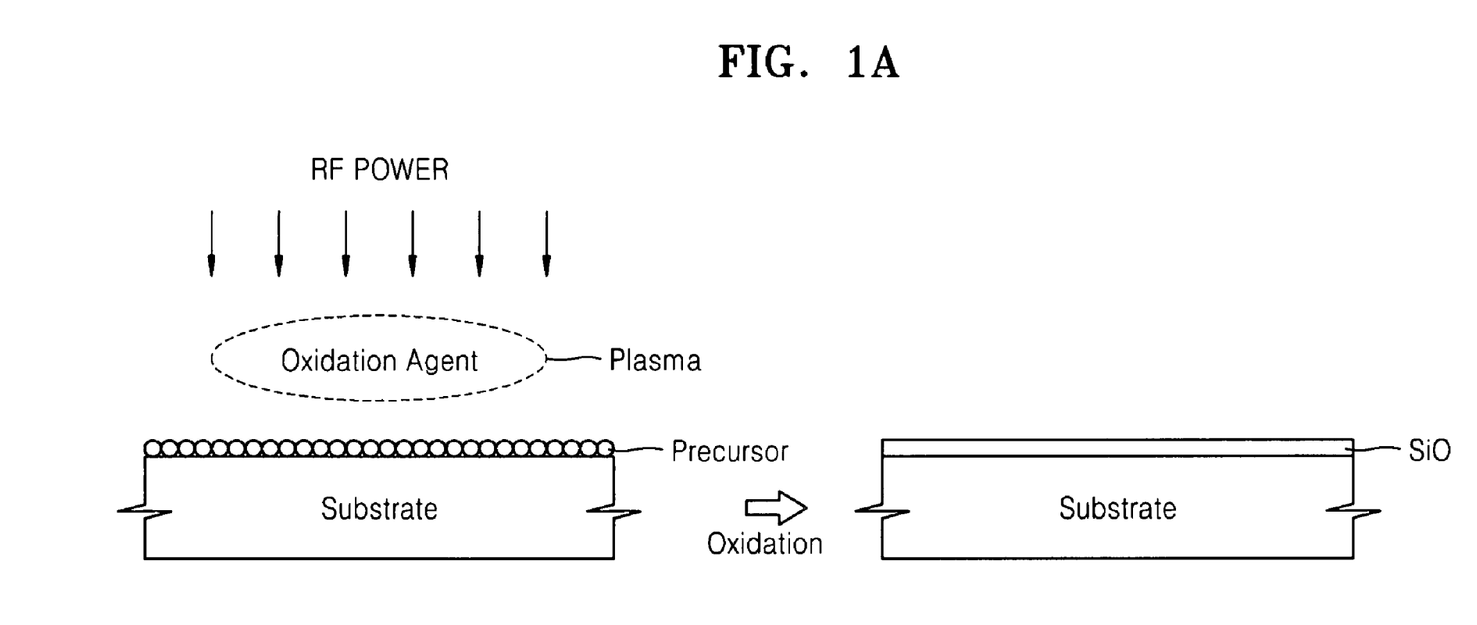
FIGS. 1A and 1B illustrate a method of manufacturing silicon rich oxide (SRO) according to an example embodiment of the invention.
Figure 1B:
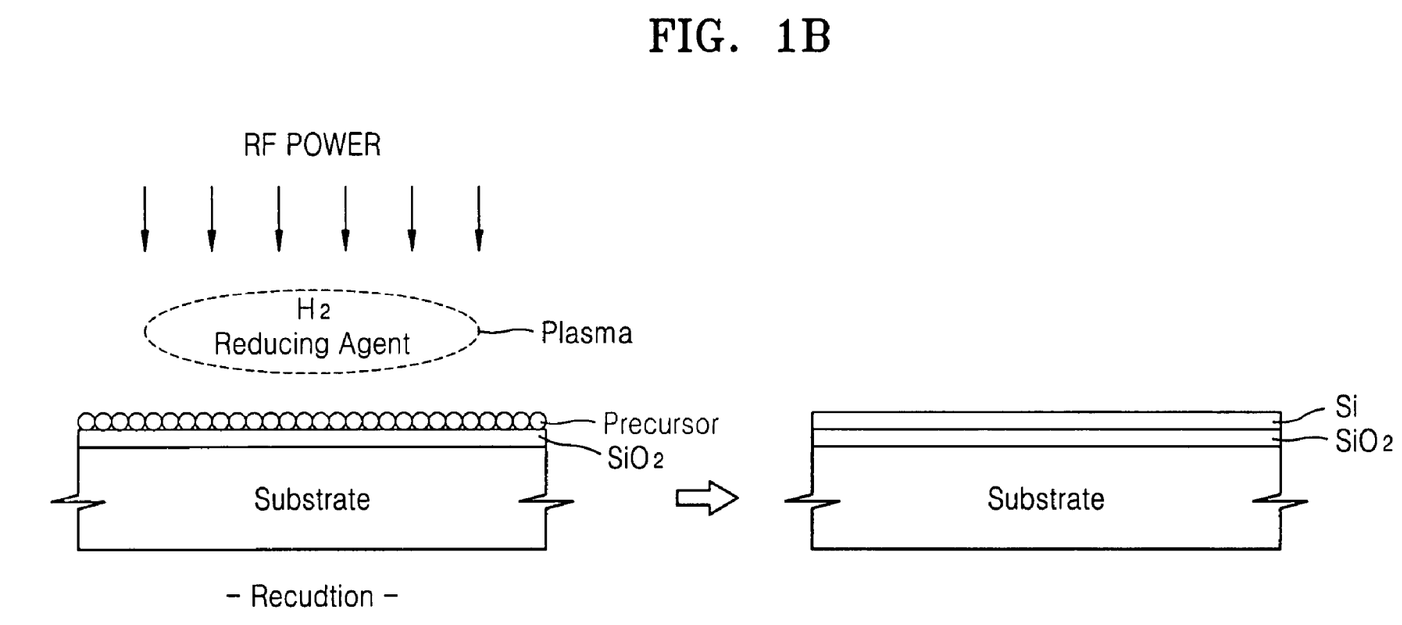

A method of manufacturing silicon rich oxide (SRO) according to an example embodiment of the invention includes forming both a silicon oxide layer, for example, $SiO_2$, and a silicon layer using atomic layer deposition (ALD) processes as shown in FIGS. 1A and 1B. More specifically, after a silicon precursor is absorbed onto a substrate, an appropriate reaction gas is introduced into the reaction chamber in which RF power is applied to the reaction gas to generate a plasma. When the reaction gas is $H_2O$, an oxidizing plasma is generated. When the reaction gas is $H_2$, hydrogen plasma is generated. When reaction energy is supplied to the precursor by the oxidizing plasma and the reducing plasma, the corresponding oxidation and reduction reactions are initiated between the absorbed silicon precursor molecule and the reaction gases to produce a silicon oxide layer, for example, $SiO_2$, or a silicon layer respectively. The ALD formation sequences for the silicon oxide layer(s) and the silicon layer(s) may be alternated to form a SRO layer having a multilayer structure. As will be appreciated by those skilled in the art, the relative number and thickness of the various silicon oxide and silicon layers incorporated in such a multilayer SRO layer may be used to control the bulk Si:O ratio of the SRO layer.

Another material layer may be formed on a substrate before formation of the SRO. It will also be understood that when the SRO is referred to as being "on" a structure, for example, a substrate, material layer, pattern or multilayer structure, the SRO can be in direct contact with the referenced structure or one or more intervening layers may be provided between the referenced structure and the SRO. For example, when a SRO according to an example embodiment of the invention is utilized as a gate insulating layer in a transistor or as a capacitor dielectric layer, other structures necessary for proper functioning of the transistor and/or capacitor will have been previously formed in the substrate and will remain below the SRO. Furthermore, as will be appreciated by those skilled in the art, the particular stacking order and the number of layers incorporated in the SRO structures discussed below in connection with the example embodiments are provided by way of example and should not be interpreted as limiting the scope of the invention.

Figure 2:
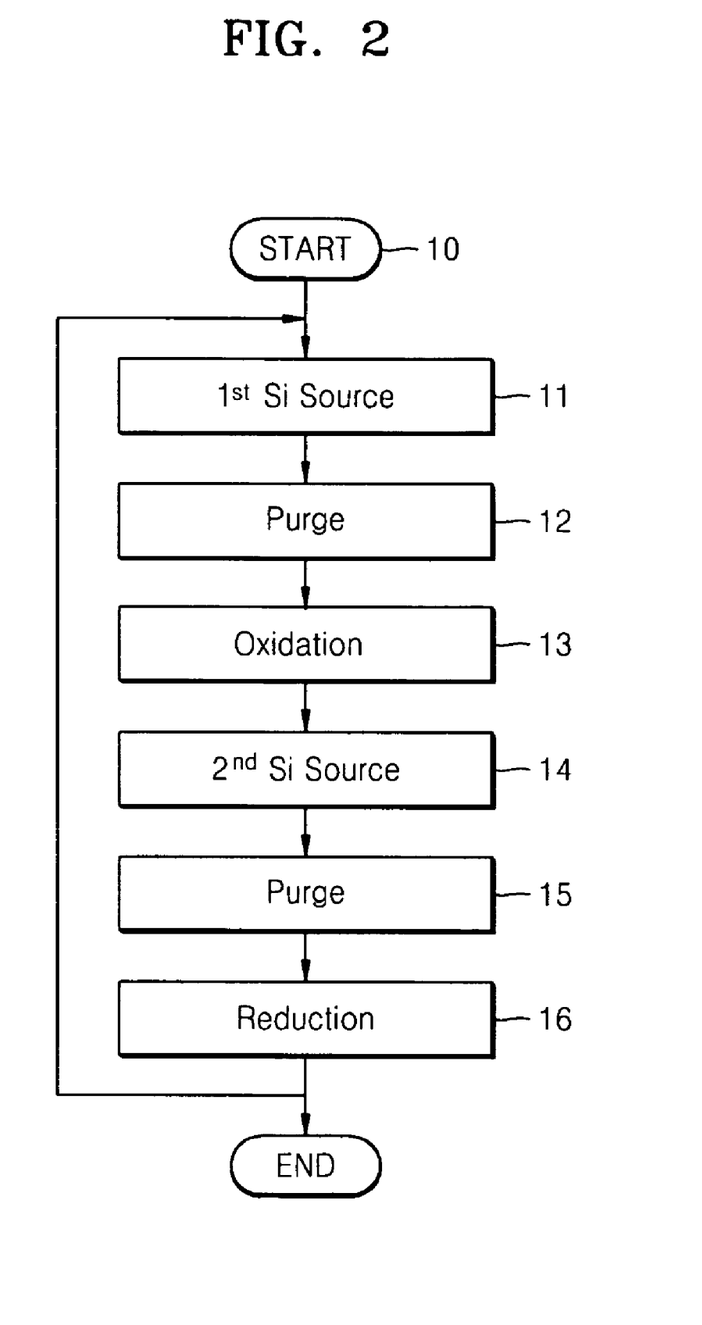
FIG. 2 is a flowchart illustrating a method of manufacturing SRO according to an example embodiment of the invention.

FIG. 2 is a flowchart illustrating a method of manufacturing SRO using ALD processes according to an example embodiment of the invention. As reflected in FIG. 2, the steps include:

a) After a substrate is loaded into an ALD chamber, a first silicon source gas is introduced into the ALD chamber with a portion of the first silicon source gas being absorbed onto the substrate surface to form a first silicon source layer, a purge gas, for example, Ar, is then introduced into the ALD chamber (steps 10 through 12) to remove the unabsorbed first silicon source gas;

b) An oxidation agent, for example, $H_2O$, is then introduced into the ALD chamber and exposed to RF power sufficient to generate an oxidizing plasma that, in turn, oxidizes the first silicon source layer to form a silicon oxide layer, for example, $SiO_2$, on the substrate surface (step 13);

c) The steps a) and b) may be repeated to form a silicon oxide layer including multiple silicon oxide atomic layers to provide a thicker silicon oxide layer;

d) A second silicon source gas, which may be the same as the first silicon source gas, is then introduced into the ALD chamber with a portion of the second silicon source gas being absorbed onto the substrate surface, e.g., the $SiO_2$ layer, to form a second silicon source layer, a purge gas, for example, Ar, is then introduced to remove the unabsorbed silicon source gas from the ALD chamber (steps 14 and 15);

e) A reduction agent, for example, $H_2$, is then introduced into the ALD chamber and exposed to RF power sufficient to generate a plasma that, in turn, reduces the second silicon source layer to form a silicon layer is formed on the surface of the silicon oxide layer (step 16);

f) The steps d) and e) may be repeated to form a silicon layer including multiple silicon atomic layers to provide a thicker silicon layer; and g) The steps a) through f) may be repeated as desired to form a stacked structure of alternating silicon oxide and silicon layers to form a composite SRO layer or structure having a desired thickness and providing a target Si:O ratio.

As will be appreciated by those skilled in the art, the Si:O ratio in the composite SRO structure may be controlled by adjusting the relative thickness and/or number of the silicon oxide layers and silicon layers included in the SRO structure. For example, increasing the relative volume of the silicon oxide layers will tend to reduce the Si:O ratio while increasing the relative volume of the silicon layers will tend to increase the Si:O ratio.

In a method according to an example embodiment of the invention, a silicon source gas, for example, hexachlorodisilane (HCDS), may supplied from an evaporator to the reaction chamber at temperature of 25° C. at pressure above about 10 Torr to form an absorbed silicon source layer on the substrate. After the unabsorbed silicon source gas is removed, the corresponding oxidation agent or reduction agent can be introduced into the reaction chamber and, in the case of plasma-enhanced atomic layer deposition (PEALD), exposed to sufficient RF power to generate a corresponding plasma that will react with the silicon source layer.

Figure 3:
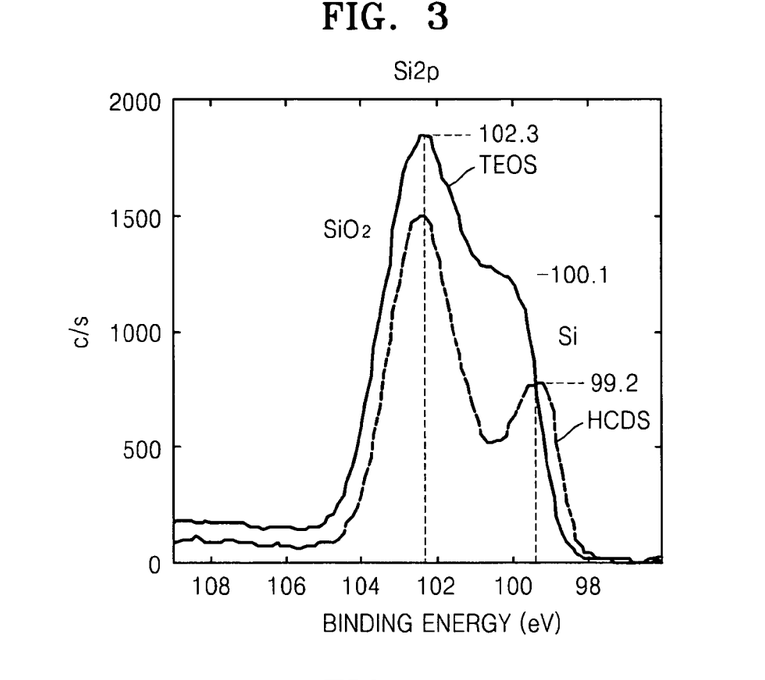
FIG. 3 is an X-ray photoelectron spectroscopy (XPS) graph of thin films manufactured using tetraethoxysilane (TEOS) and hexachlorodisilane (HCDS) respectively as silicon source gases.

FIG. 3 is an X-ray photoelectron spectroscopy (XPS) graph comparing thin SRO films manufactured using a conventional process using tetraethoxysilane (TEOS) and a process according to an example embodiment of the invention using HCDS as the silicon source gas. As evident from the data reflected in FIG. 3, the thin film obtained using HCDS exhibits a more distinct Si peak than does the thin film obtained using the conventional TEOS source.

Figure 4:
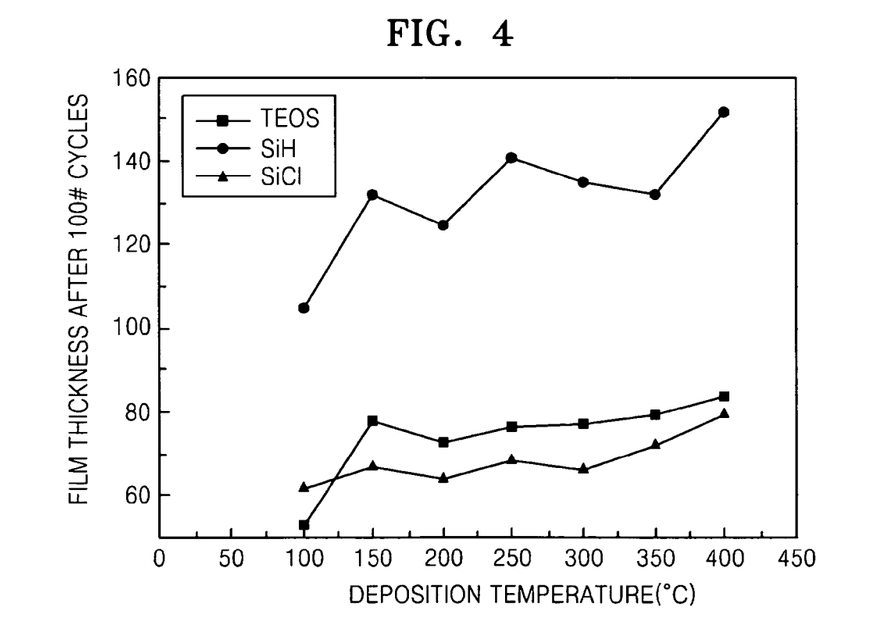
FIG. 4 is a graph illustrating the thicknesses of thin films deposited after 100 cycles under the same deposition conditions using TEOS, $SiH_4$, and HCDS respectively as the silicon source as a function of the deposition temperature.

FIG. 4 is a graph illustrating the thicknesses of thin films deposited after 100 cycles under the same deposition conditions using TEOS, $SiH_4$, and HCDS as silicon sources plotted with respect to deposition temperature. As evident from FIG. 4, similar deposition rates may be maintained using HCDS as the silicon source when compared to the conventional TEOS silicon source. Accordingly, the use of HCDS as the silicon source gas for the formation of SRO layers can be incorporated into conventional semiconductor fabrication processes while maintaining similar productivity.

Figure 5A:
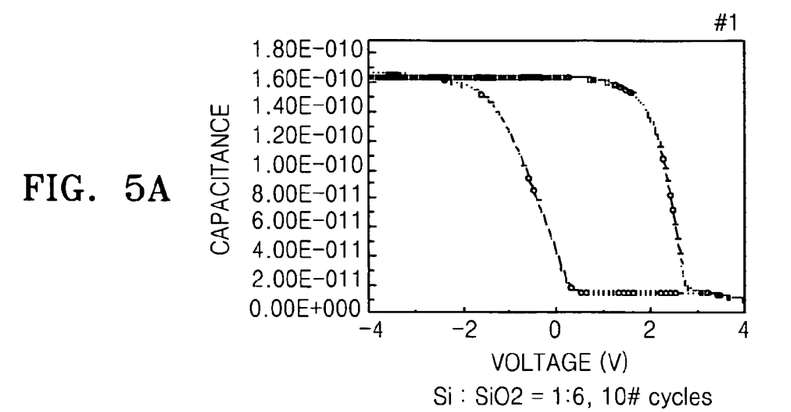
FIGS. 5A-5C are graphs illustrating electrical characteristics of SRO samples manufactured using methods according to the example embodiments of the invention.
Figure 5B:
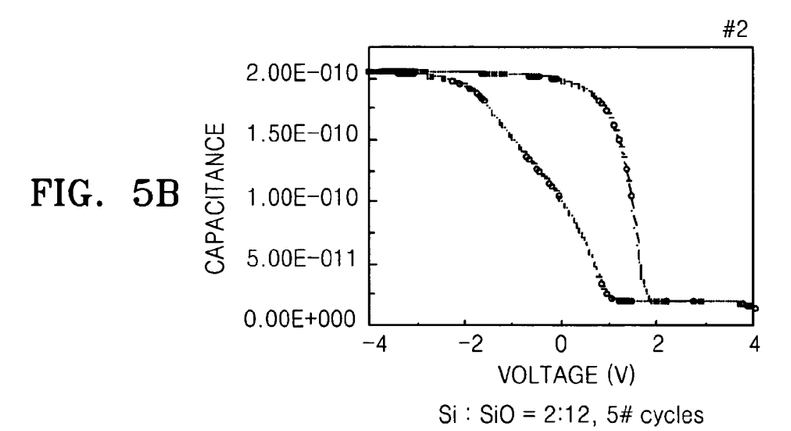
Figure 5C:
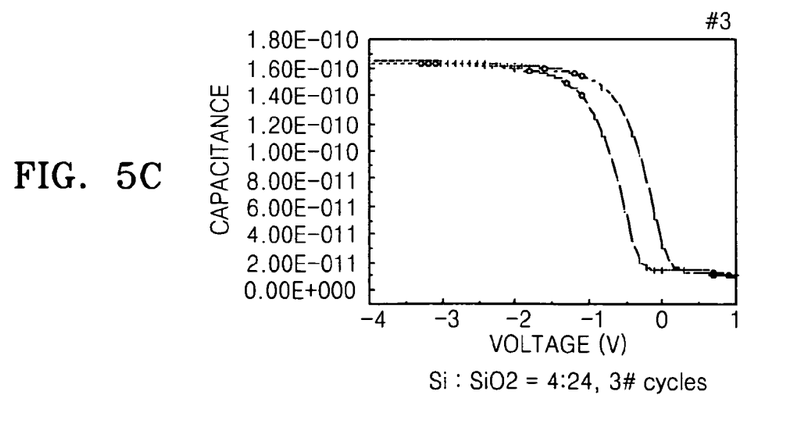

FIGS. 5A-5C are graphs illustrating electrical characteristics of SRO samples 1, 2, and 3 respectively manufactured according to various example embodiments of methods according to the invention.

Sample 1 was formed by depositing Si and $SiO_2$ with a stacking ratio of 1:6 over 10 cycles. Sample 2 was formed by depositing Si and $SiO_2$ with a stacking ratio of 2:12 over 5 cycles. Sample 3 was formed by depositing Si and $SiO_2$ with a stacking ratio of 4:24 over 3 cycles. As used herein, the referenced ratios, e.g., 1:6 as in Sample 1, indicate the respective numbers of silicon ALD layer(s) and silicon oxide ALD layer(s) formed during a single cycle. The number of cycles, e.g., 10 as in Sample 1, in turn, indicates how many times the indicated combination of silicon and silicon oxide layers were deposited to form the final thickness of the SRO layer.

As evident from a comparison of the capacitance-voltage (C-V) data illustrated in FIGS. 5A-5C, SRO Sample 1, which was formed by depositing a unit stack structure consisting of a single silicon layer and six silicon oxide layers over 10 cycles exhibits C-V characteristics superior to that of Samples 2 and 3. Accordingly, stress voltage measurements at 10 V suggest that semiconductor devices fabricated according to the example embodiment of Sample 1 can provide a memory window of greater than 3.2 V.

The manufacturing methods according to the example embodiments of the invention utilize ALD methods to obtain SRO layers having improved step coverage relative to the step coverage that can be obtained using conventional CVD processes. In addition, the manufacturing method according to the example embodiments provide this improved step coverage in combination with improved electrical performance afforded by the improved degree of control over the Si:O ratio in the resulting SRO layer.

Figure 6A:
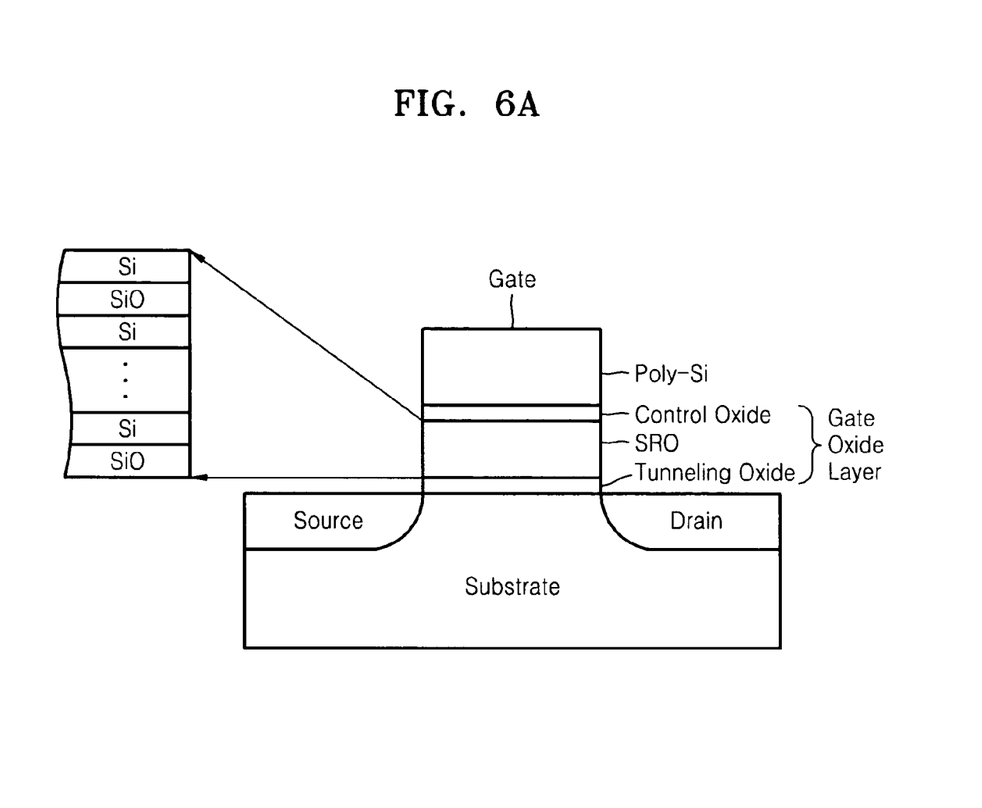
FIGS. 6A and 6B illustrate the example embodiments of stack structures that may be incorporated in non-volatile memory devices manufactured according to example embodiments of the invention.
Figure 6B:
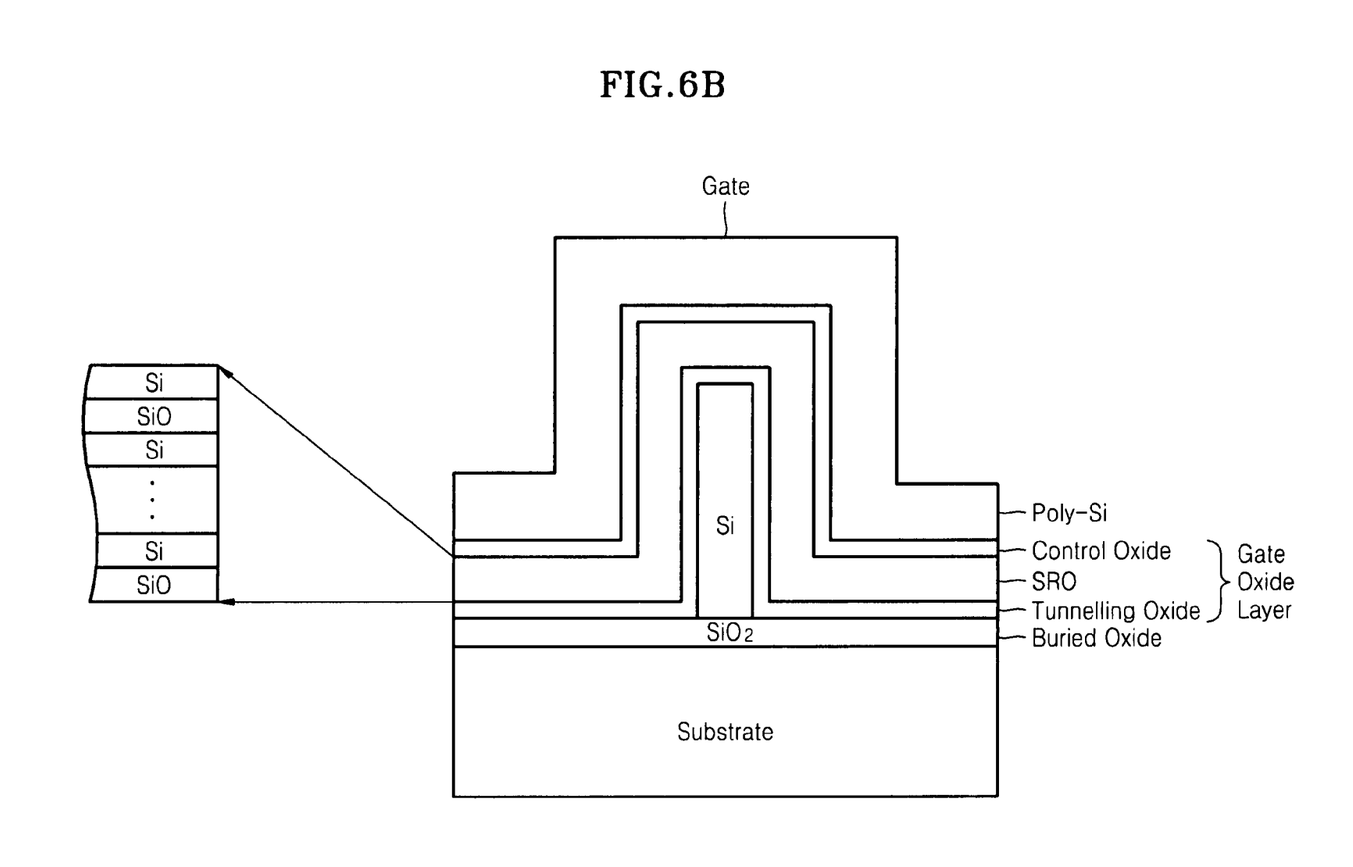

FIGS. 6A and 6B illustrate examples of stack structures that may be utilized in non-volatile memory devices that may be manufactured according to example embodiments of the invention.

As illustrated in FIG. 6A, the stack structure is formed by forming a gate oxide layer on a p-type substrate and then forming a conductive gate electrode, for example, by using doped polysilicon, metals, metal silicides, metal nitrides or a combination thereof, on the gate oxide layer. As also illustrated in FIG. 6A, the gate oxide layer may be fabricated as a multilayer structure in which a lower tunneling oxide layer is formed on the substrate, a SRO layer is formed on the lower tunneling oxide layer, and an upper control oxide layer is formed on the SRO layer. As further illustrated in FIG. 6A, the SRO layer may be fabricated using a method according to an example embodiment of the invention to provide an SRO layer having alternating silicon oxide and silicon layers. The SRO layer will include at least one silicon oxide layer and at least one silicon layer with both layers having a minimum thickness of one atomic layer.

The gate stack structure illustrated in FIG. 6A with its multilayer SRO layer may then be incorporated into a transistor using conventional fabrication techniques including, for example, photolithographic processes, deposition processes, etch processes, planarization processes, ion implantation for forming source/drain regions in the substrate, formation of sidewall spacers structures adjacent the gate stack structure, formation of lightly-doped drain (LDD) regions in the substrate adjacent the gate stack structure and formation of multilayer contact and interconnection structures to produce functional semiconductor devices.

FIG. 6B is a cross-sectional view of a transistor that incorporates both a SRO layer and a fin-shaped structure of semiconductor material in which an active layer is established on the vertical surfaces. As described above with reference to FIG. 6A, the transistor may be fabricated with a gate oxide layer that includes a multi-layered SRO layer according to the invention and a gate electrode overlying the gate oxide layer. A discussion of background art relating to fin-type transistors can be found in Korean Patent Application No. 2004-0008598, the disclosure of which is incorporated herein in its entirety by reference.

An example embodiment of a method for manufacturing a fin-type transistor will now be further described with reference to FIGS. 7A-7J. As those of ordinary skill in the art will be well acquainted with conventional processes utilized in the fabrication of semiconductor devices, detailed explanations of such conventional processes are considered unnecessary and will be omitted. Further, as noted above, the relative thicknesses of layers and configuration of illustrated regions are not intended to be to scale, but may be enlarged or reduced for the purpose of illustration and improved clarity.

Figure 7A:
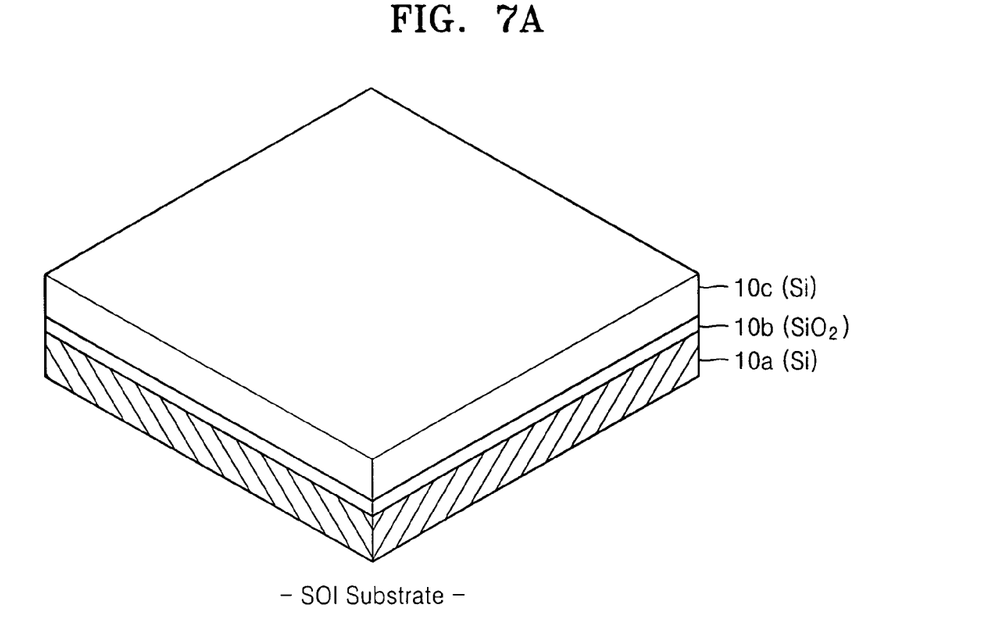
FIGS. 7A-7J illustrate steps of a method of manufacturing a fin-type transistor according to an example embodiment of the invention.
Figure 7B:
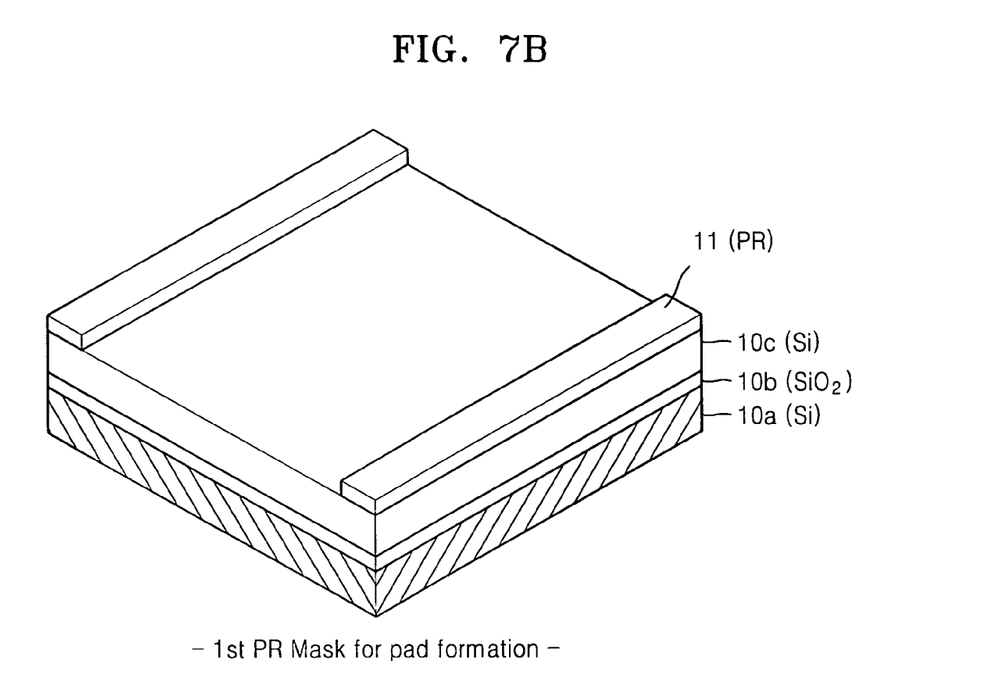
Figure 7C:
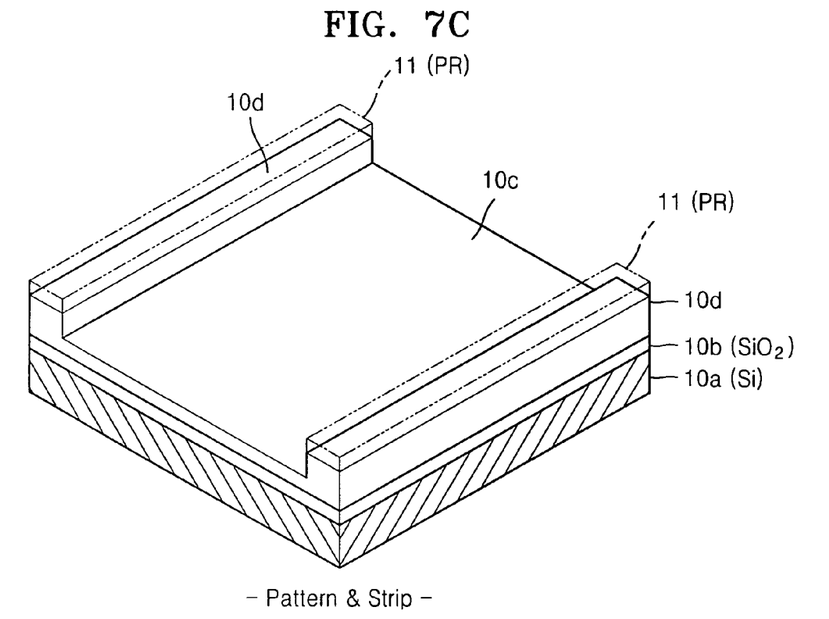

As illustrated in FIG. 7A, a silicon on insulator (SOI) substrate 10 with a lower Si substrate 10a, an intervening insulating layer 10b, an upper Si substrate 10c is prepared. As shown in FIG. 7B, a first photoresist pattern 11 for forming pads for the fin-type transistor are then formed on the upper Si substrate 10c. As illustrated in FIG. 7C, an upper portion of the upper Si substrate 10c is then removed from those regions not protected by the first photoresist pattern 11, typically by using a dry etch process, with the unetched portions of the upper Si substrate 10c forming pads 10d that project or protrude from the remaining portion of the upper Si substrate. The first photoresist pattern 11 is then removed or stripped to expose the pads 10d.

Figure 7D:
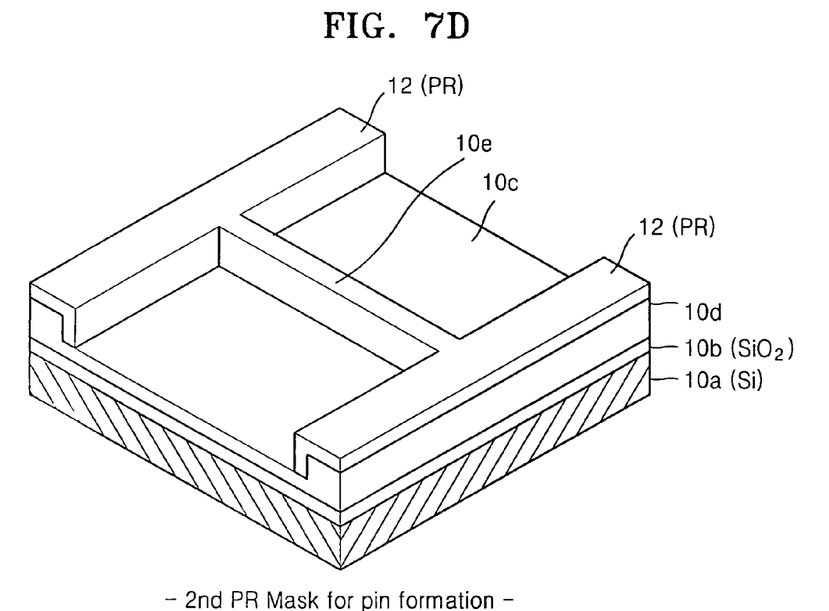
Figure 7E:
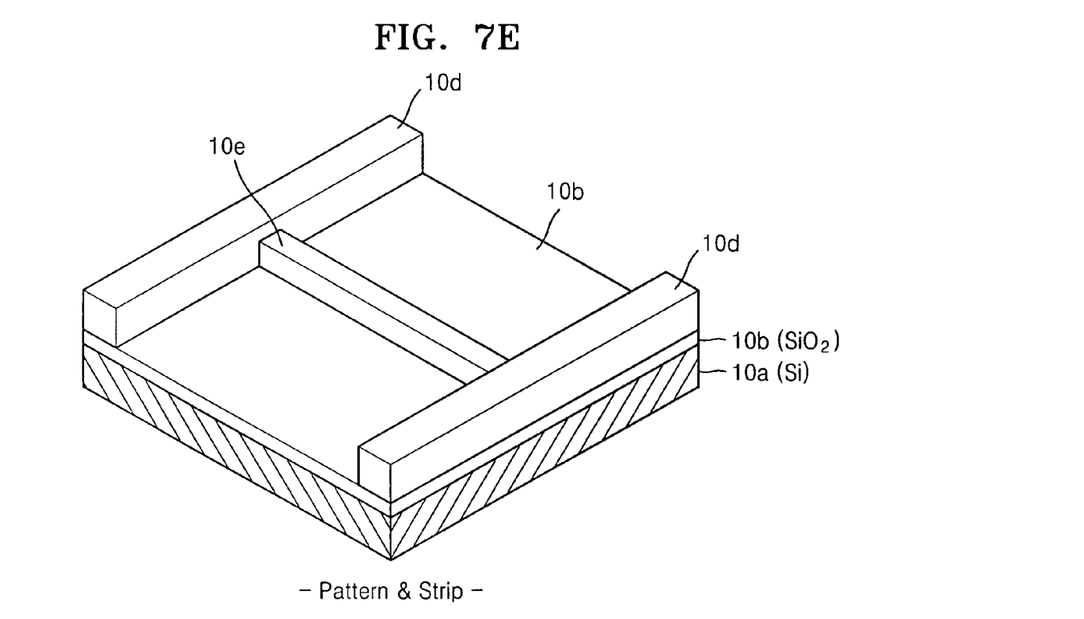

As illustrated in FIG. 7D, a second photoresist pattern 12 is formed on the substrate to protect both the pads 10d and a portion of the residual upper Si substrate 10c extending between the two pads. The second photoresist mask may be patterned using electron-beam lithography or any other photolithographic technique that provides the necessary resolution and alignment performance. As illustrated in FIG. 7E, an additional thickness of the upper Si substrate 10c is then removed from the regions not protected by the second photoresist mask 12, typically using a dry etch process, to obtain a fin-shaped active layer 10e that extends between the two pads 10d. After the fin-shaped active layer 10e has been formed, the second photoresist mask 12 may be removed using, for example, a stripping and/or ashing process.

Figure 7F:
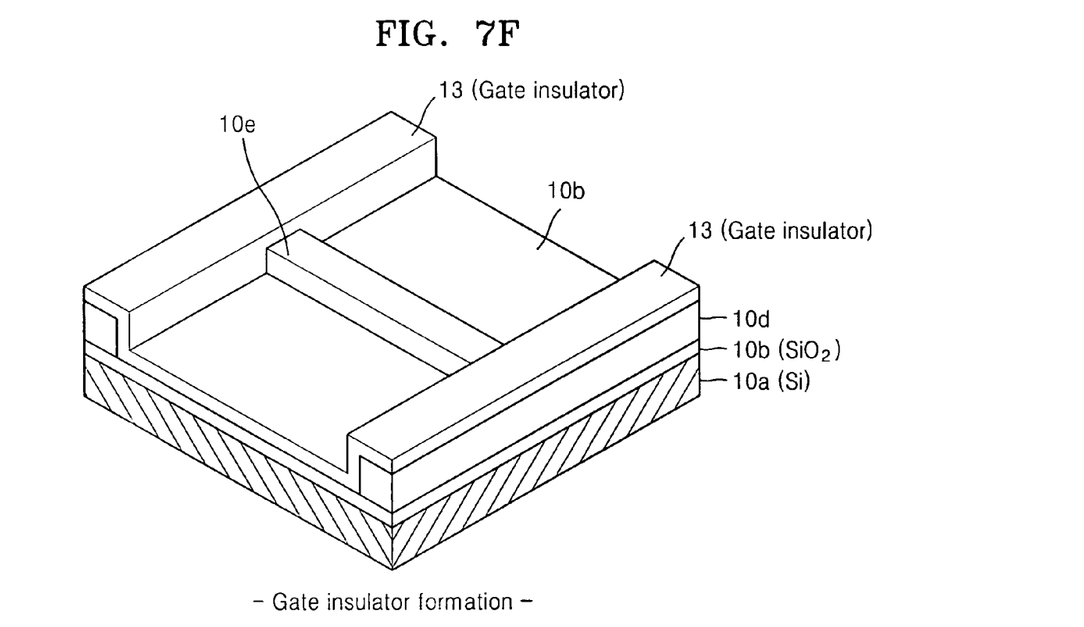

As illustrated in FIG. 7F, a multilayer gate insulating layer 13, which includes a multilayer SRO layer formed in accord with an example embodiment of the invention, a control layer and a tunneling layer, as illustrated in FIG. 6B, is then formed on the pads 10d, the active layer 10e, and the exposed portion of the insulating layer 10b. More specifically, a tunneling layer, for example, a $SiO_2$ layer, is formed using a conventional layer formation technique, for example, a thermal oxidation process, a CVD process, an ALD process or a variant thereof, a multilayer SRO layer is then formed on the tunneling layer using a method according to an example embodiment of the invention, and a control layer, for example, a $SiO_2$ layer, is formed on the SRO layer using a conventional formation technique.

Figure 7G:
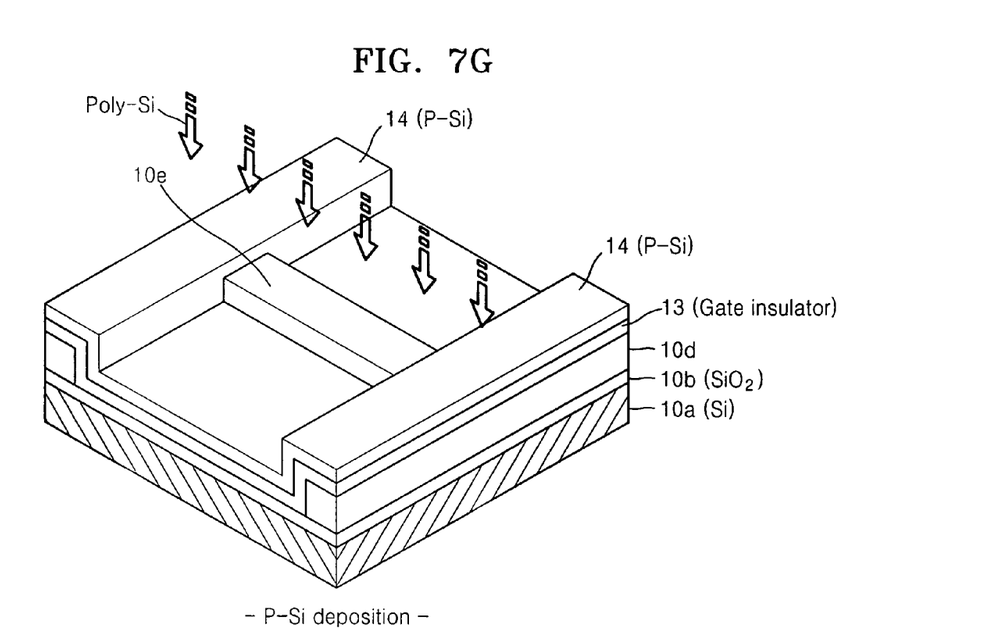
Figure 7H:
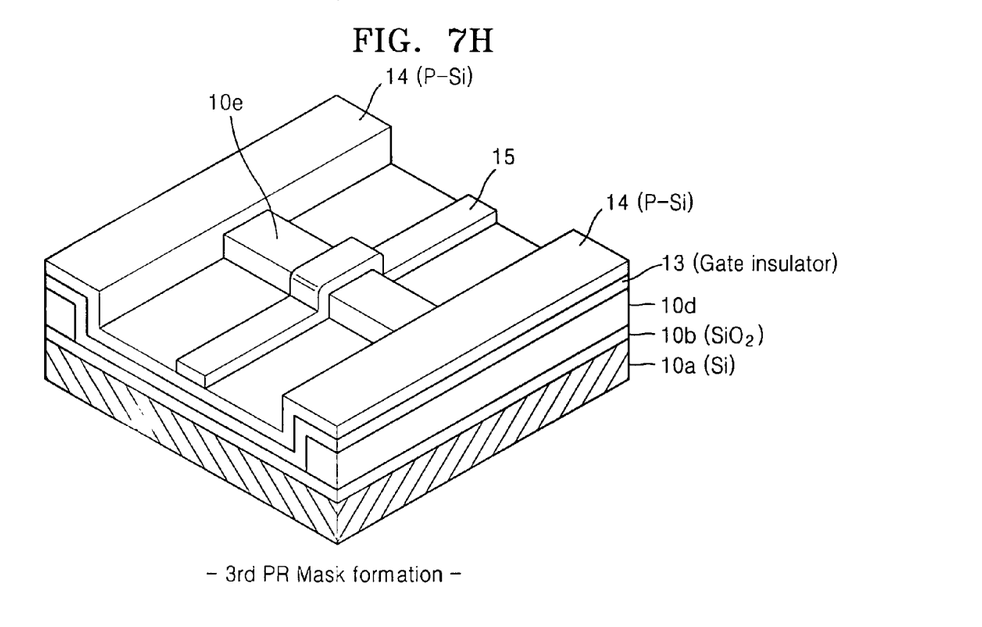
Figure 7I:
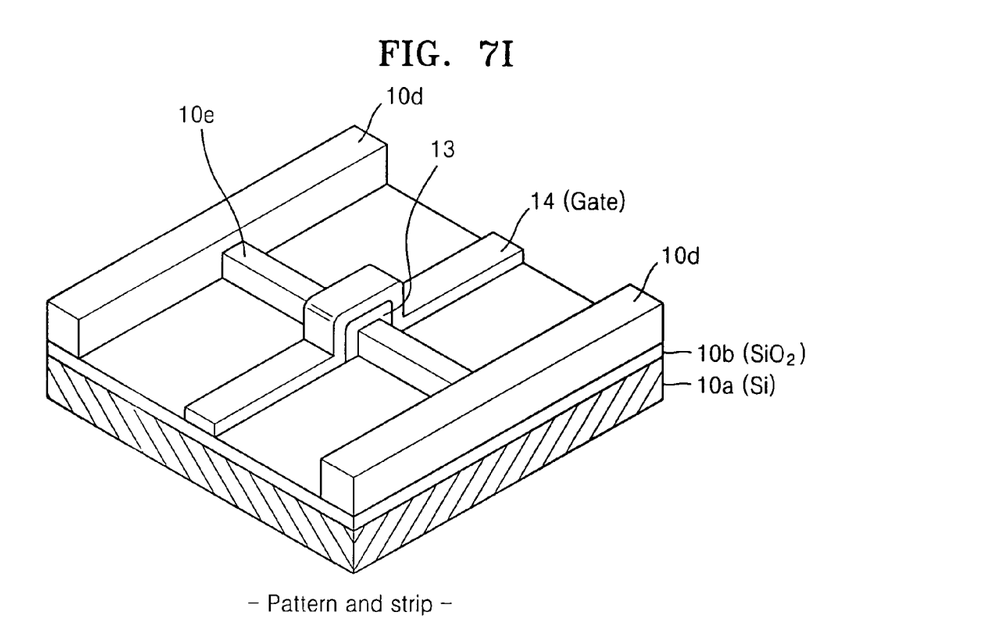
Figure 7J:
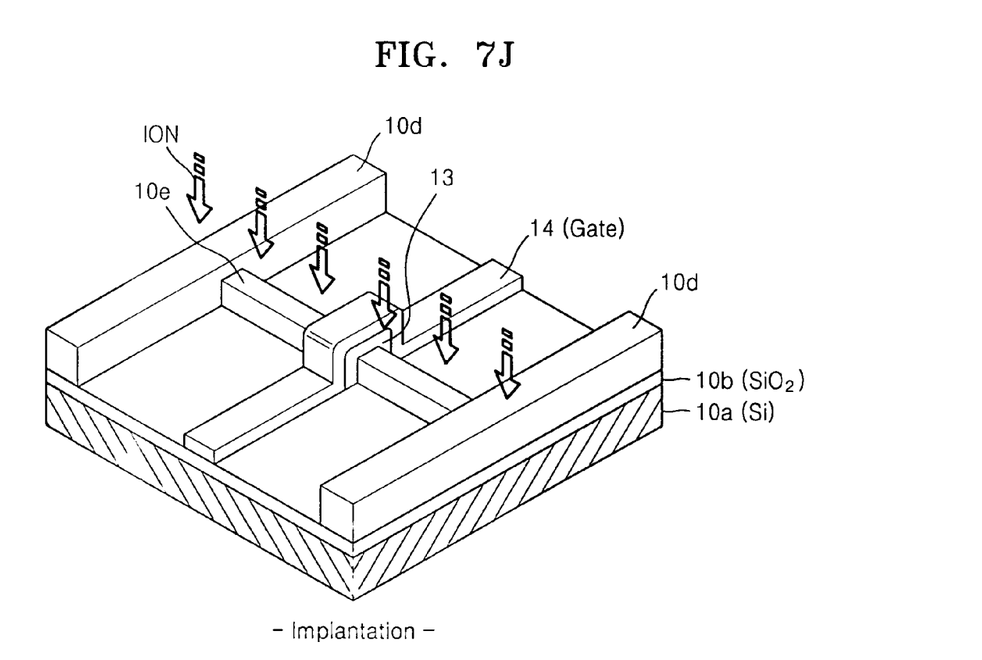

As illustrated in FIG. 7G, a conductive layer 14, for example, one or more layers of polysilicon, metal, metal silicide and/or metal nitride, from which the gate electrode will be formed is then deposited and/or created on the surface of the control layer. As illustrated in FIG. 7H, a third photoresist pattern 15 is formed on the conductive layer 14 in order to protect portions of the conductive layer 14 during a subsequent gate etch process. As illustrated in FIG. 7I, the exposed portions of the conductive layer 14 and the underlying portions of the gate insulating layer 13 are then removed to form a gate electrode 15a and a gate dielectric region 13a. The third photoresist pattern 15 can then be removed from the substrate using a conventional ashing or stripping process. As shown in FIG. 7J, a conventional ion implantation technique may then be utilized for modifying the doping, and consequently, the electrical characteristics, of those portions of the active layer 10e that are not covered by the gate 14a and the pads 10d.

As detailed above, when forming a SRO layer according to an example embodiment of the invention, alternating silicon oxide layers and silicon layers are formed using a silicon source material. Accordingly, the bulk oxygen concentration within the composite SRO can be adjusted by controlling the relative thickness(es) and number of the respective silicon oxide and silicon layers incorporated in the SRO layer. In this way, the methods according to the example embodiments provide a direct method for adjusting the oxygen concentration and, accordingly, controlling the Si:O ratio, within the SRO layer. For example, the oxygen concentration may be controlled by adjusting the number of separate silicon oxide and silicon layers formed in a stack and/or the number of stacking cycles utilized to form the SRO layer and may be utilized to improve the electrical performance and/or reliability of the resulting SRO layers and the active devices that incorporate such layers. Again, as noted above, the use of ALD for forming the silicon oxide and silicon layers provides improved step coverage relative to that which can be achieved using conventional CVD processing, particularly on surfaces having complicated and/or high aspect ratio structures, for example, semiconductor devices including finFET transistors and/or charge storage structures. Such semiconductor devices will include, for example, non-volatile memory devices incorporating charge storage structures in the memory cells.

While the invention has been particularly shown and described with reference to certain example embodiments thereof, these embodiments are presented by way of example only and should not be understood or interpreted as unduly limiting the scope of the invention to the particular structures and processes described above and/or illustrated in the attached Figures. That is, it will be understood by those of ordinary skill in the art that various changes in form and details may be made therein without departing from the spirit and scope of the invention as defined by the following claims.

What is claimed is:

1. A method of forming a silicon rich oxide (SRO) layer on a substrate comprising:
   a) introducing the substrate into a reaction chamber;
   b) introducing a first silicon source gas into the reaction chamber under conditions whereby a portion of the first silicon source gas is absorbed on a first substrate surface to form a first silicon source layer, the first silicon source gas being substantially free of oxygen;
   c) introducing a first reaction gas into the reaction chamber under conditions sufficient to form an oxidizing plasma;
   d) reacting the first silicon source layer and the oxidizing plasma to form a silicon oxide layer on the first substrate surface;
   e) introducing a second silicon source gas into the reaction chamber under conditions whereby a portion of the second silicon source gas is absorbed on a surface of the silicon oxide layer to form a second silicon source layer, the second silicon source gas being substantially free of oxygen;
   f) introducing a second reaction gas into the reaction chamber under conditions sufficient to form a reducing plasma; and
   g) reacting the second silicon source layer and the reducing plasma to form a silicon layer, wherein the combination of the silicon oxide layer and the silicon layer comprise the SRO layer.

2. The method of forming a silicon rich oxide (SRO) layer according to claim 1, further comprising:
   repeating steps b) through g) to form a plurality of silicon oxide layers, wherein the silicon oxide layers are separated by a plurality of silicon layers.

3. The method of forming a silicon rich oxide (SRO) layer according to claim 1, further comprising:
   repeating steps b) through d) to form a multilayer silicon oxide layer; and
   repeating steps e) through g) to form a multilayer silicon layer on the multilayer silicon oxide layer.

4. The method of forming a silicon rich oxide (SRO) layer according to claim 1, wherein:
   first reaction gas is selected from a group consisting of $H_2O$, $H_2O_2$, $O_2$, $O_3$ and mixtures thereof; and
   the second reaction gas is selected from a group consisting of $H_2$, $NH_3$, HCl and mixtures thereof.

5. The method of forming a silicon rich oxide (SRO) layer according to claim 1, wherein:
   the first silicon source gas and the second silicon sources are selected from a group consisting of $SiX_aH_b$, $Si_2X_cH_d$ and mixtures thereof, wherein X represents a halogen selected from a group consisting of Cl, F, Br and mixtures thereof, and further wherein a, b, c and d are integers satisfying the expressions a+b=4 and c+d=6.

6. The method of forming a silicon rich oxide (SRO) layer according to claim 5, wherein:
   the first silicon source gas and second silicon source gas are identical.

7. The method of forming a silicon rich oxide (SRO) layer according to claim 6, wherein:
   the first and second silicon source gases are hexachlorodisilane (HCDS).

8. The method of forming a silicon rich oxide (SRO) layer according to claim 6, wherein:
   the first reaction gas is $H_2O$; and
   the second reaction gas is $H_2$.

9. The method of forming a silicon rich oxide (SRO) layer according to claim 3, wherein:
   the first and second silicon source gases are HCDS.

10. The method of forming a silicon rich oxide (SRO) layer according to claim 9, wherein:
    the first reaction gas is $H_2O$; and
    the second reaction gas is $H_2$.

11. A method of manufacturing a semiconductor device comprising:
    forming an active region on a semiconductor substrate;
    forming a gate insulating layer on the active region; and
    forming a gate electrode on the gate insulating layer for controlling an electrical field within the portion of the active layer underlying the gate electrode,
    wherein forming the gate insulating layer further comprises fabricating a silicon rich oxide (SRO) layer by
    a) absorbing a first silicon source gas onto a substrate surface to form a first silicon source layer, the first silicon source gas being substantially free of oxygen;
    b) oxidizing the first silicon source layer to form a silicon oxide layer;
    c) absorbing a second silicon source gas onto a substrate surface to form a second silicon source layer, the second silicon source gas being substantially free of oxygen; and
    d) reducing the second silicon source layer to form a silicon layer;
    wherein the silicon oxide layer and the silicon layer comprise the SRO layer.

12. The method of manufacturing a semiconductor device according to claim 11, further comprising:
    repeating steps a) through d) to form a multilayer SRO layer having alternating silicon oxide layers and silicon layers.

13. The method of manufacturing a semiconductor device according to claim 12, wherein forming the multilayer SRO layer further comprises at least one operation selected from a group consisting of
    repeating steps a) and b) to form a multilayer silicon oxide layer before forming a next silicon layer and
    repeating steps c) and d) to form a multilayer silicon layer before forming a next silicon oxide layer.

14. The method of manufacturing a semiconductor device according to claim 12, wherein:
    steps a) and b) are repeated M times to form a silicon oxide layer before forming a next silicon layer; and
    steps c) and d) are repeated N times to form a silicon layer before forming a next silicon oxide layer, wherein N and M are positive integers that satisfy the expression M>N.

15. The method of manufacturing a semiconductor device according to claim 11, wherein:
    the first silicon source gas and the second silicon sources are selected from a group consisting of $SiX_aH_b$, $Si_2X_cH_d$ and mixtures thereof, wherein X represents a halogen selected from a group consisting of Cl, F, Br and mixtures thereof, and further wherein a, b, c and d are integers satisfying the expressions a+b=4 and c+d=6.

16. The method of manufacturing a semiconductor device according to claim 11, wherein:
the first silicon source gas and the second silicon sources are selected from a group consisting of $SiCl_aH_b$, $Si_2Cl_cH_d$ and mixtures thereof, and further wherein a, b, c and d are integers satisfying the expressions a+b=4 and c+d=6.

17. The method of manufacturing a semiconductor device according to claim 16, wherein:
both the first silicon source gas and second silicon source gas are hexachlorodisilane (HCDS).

18. The method of manufacturing a semiconductor device according to claim 17, wherein:
the first reaction gas is $H_2O$; and
the second reaction gas is $H_2$.

19. The method of manufacturing a semiconductor device according to claim 14, wherein:
M and N define an M:N ratio of 4:1 to 7:1.

20. The method of manufacturing a semiconductor device according to claim 19, wherein:
N is no greater than 2.

21. The method of manufacturing a semiconductor device according to claim 11, wherein forming the active region further comprises:
forming a vertically elongated semiconductor fin structure extending from semiconductor substrate; and
forming the active region on vertical surfaces of the fin structure.

22. A method of manufacturing SRO (Silicon Rich Oxide) having $SiO_2$ and extra Si on a substrate, the method comprising:
absorbing a first silicon source gas containing no oxygen onto the substrate and forming a $SiO_2$ layer by oxidation reaction between a reaction gas containing oxygen and the first silicon source gas; and
forming a Si layer as a result of reduction reaction between a second silicon source gas containing no oxygen and a reaction gas under conditions sufficient to form a reducing plasma corresponding to the second silicon source gas.

23. The method of claim 22, wherein the forming of the $SiO_2$ layer and the forming of the Si layer are alternately repeated with a predetermined period to form a multilayer stack of alternate $SiO_2$ and Si layers by oxidation and reduction reactions.

24. The method of claim 22, wherein the $SiO_2$ layer and the Si layer each have a multilayer structure.

25. The method of claim 22, wherein oxygen plasma is supplied during the forming of the $SiO_2$ layer and hydrogen plasma is supplied during the forming of the Si layer.

26. The method of claim 22, wherein the first and second silicon sources are the same precursor.

27. The method of claim 22, wherein the first and second silicon sources are a SiCl-based precursor.

28. The method of claim 22, wherein the first and second silicon sources are HCDS (Hexa-Chloro-Di-Silane).

29. The method of claim 27, wherein the reaction gas for the first silicon source is $H_2O$ and the reaction gas for the second silicon source is $H_2$.

30. The method of claim 24, wherein the first and second silicon sources are HCDS.

31. The method of claim 30, wherein the reaction gas for the first silicon source is $H_2O$ and the reaction gas for the second silicon source is $H_2$.

* * * * *